United States Patent
Dupuy et al.

(10) Patent No.: US 7,680,622 B2
(45) Date of Patent: Mar. 16, 2010

(54) PROTECTION OF AN INTEGRATED CIRCUIT AND METHOD THEREOF

(75) Inventors: Philippe Dupuy, Toulouse (FR); Laurent Guillot, Seysses (FR); Eric Moreau, Plaisance du Touch (FR); Pierre Turpin, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 50 days.

(21) Appl. No.: 11/911,324

(22) PCT Filed: Apr. 13, 2005

(86) PCT No.: PCT/EP2005/005208

§ 371 (c)(1),
(2), (4) Date: Oct. 11, 2007

(87) PCT Pub. No.: WO2006/108444

PCT Pub. Date: Oct. 19, 2006

(65) Prior Publication Data

US 2008/0208513 A1    Aug. 28, 2008

(51) Int. Cl.
G01K 13/00      (2006.01)
G05D 23/00      (2006.01)
G06F 19/00      (2006.01)

(52) U.S. Cl. .................. 702/132; 374/141; 374/152; 700/299; 702/127; 702/130; 702/187; 702/189; 713/300

(58) Field of Classification Search .................. 702/132, 702/1, 127, 130, 182, 187, 188, 189; 700/21, 700/1, 9, 11, 22, 90, 95, 108, 286, 292, 295, 700/297, 299; 374/1, 45, 100, 137, 141, 374/152; 713/300, 320, 330, 340
See application file for complete search history.

(56) References Cited

U.S. PATENT DOCUMENTS 3,237,448 A * 3/1966 Howell et al. .............. 702/132

(Continued)

FOREIGN PATENT DOCUMENTS

EP       0 262 530 A1 *  9/1987

(Continued)

OTHER PUBLICATIONS

Dziurdzia et al; "High Efficiency Active Cooling System"; 16th IEEE Semi-therm Symposium, 2000.

(Continued)

*Primary Examiner*—Edward R Cosimano

(57) ABSTRACT

An integrated circuit comprises a power device located on a die. The power device is operably coupled to a processing function, wherein the signal processing function is operably coupled to two or more temperature sensors. A first temperature sensor is operably coupled to the power device to measure a temperature of the power device and the second temperature sensor is located, such that it measures a substantially ambient temperature related to the die. The signal processing function determines the temperature gradient therebetween.

21 Claims, 4 Drawing Sheets

U.S. PATENT DOCUMENTS

| | | | | |
|---|---|---|---|---|
| 3,362,217 A | * | 1/1968 | Rush et al. | 73/112.01 |
| 4,931,844 A | * | 6/1990 | Zommer | 257/48 |
| 5,336,943 A | * | 8/1994 | Kelly et al. | 327/513 |
| 5,406,212 A | * | 4/1995 | Hashinaga et al. | 324/760 |
| 5,444,219 A | * | 8/1995 | Kelly | 219/505 |
| 5,726,481 A | * | 3/1998 | Moody | 257/467 |
| 5,828,263 A | * | 10/1998 | Gantioler et al. | 327/512 |
| 5,886,515 A | * | 3/1999 | Kelly | 323/313 |
| 5,994,752 A | * | 11/1999 | Sander et al. | 257/467 |
| 6,031,703 A | * | 2/2000 | Serpinet et al. | 361/103 |
| 6,144,085 A | * | 11/2000 | Barker | 257/467 |
| 6,323,531 B1 | * | 11/2001 | Sander et al. | 257/467 |
| 2003/0158696 A1 | | 8/2003 | Gold et al. | |
| 2003/0182959 A1 | | 10/2003 | McKeown | |

FOREIGN PATENT DOCUMENTS

| | | |
|---|---|---|
| EP | 0 763 894 A2 * | 3/1997 |
| EP | 0763894 A2 | 3/1997 |

OTHER PUBLICATIONS

Baetselier et al; "Thermoregulation of IC's with high Power Dissipation"; 10th European Microelectronics Conference, 1995.

* cited by examiner

PROTECTION OF AN INTEGRATED CIRCUIT AND METHOD THEREOF

FIELD OF THE INVENTION

The preferred embodiment of the present invention relates to a configuration and a method for protecting an integrated circuit by reducing the likelihood of failure. The invention is applicable to, but not limited to, an integrated circuit comprising power devices, such as a silicon switch.

BACKGROUND OF THE INVENTION

During the operation of semiconductor integrated circuits (ICs), some of the electrical power carried by the IC is converted into heat. This is particularly the case with high power ICs. Thus, it is important to be able to monitor the temperature of an IC; particularly those implemented using CMOS designs. When a device's operation is temperature sensitive, a temperature reduction process may be employed.

At higher temperatures it is known that the IC's characteristics change and reliability decreases. Furthermore, under certain conditions, for example in the event of power overload, short-circuit of connections, external heating of the IC, etc., the excess heat can lead to an undesirable 'over-temperature' condition. Thus, in order to detect the over-temperature condition, and in order to protect the semiconductor ICs, an IC is often provided with a temperature protection circuit or device.

One example of a temperature-dependent IC is a lamp driver and associated switch, say to drive an incandescent lamp, where the heavy load current may heat the IC driver (and/or switch) excessively. With regard to the switch used in such circuits, it is known that bulky and expensive electromechanical relay switches have a relatively high failure rate. Such relay switches have therefore been superseded by integrated silicon switches that are much smaller (i.e. they can be implemented on an integrated circuit). Advantageously, such integrated silicon switches have a significantly lower failure rate; say in the order of ten times less.

In this regard, and referring first to FIG. 1, a known device's operation is illustrated graphically 100. In FIG. 1, the graph 100 illustrates how a bulb voltage varies, i.e. a gate-source voltage $V_{gs}$ (in Volts (V)) 115, in relation to a drain-source current $I_{ds}$ (in Amps (A)) 105 and the voltage applied to the bulb 150, i.e. a drain-source voltage $V_{ds}$ (in Volts (V)) 110.

A first mode illustrates an 'open' circuit 165, where the switch is in an 'OFF' position. Advantageously, for the voltages illustrated, this results in an off-phase power dissipation of '0' Watts, as no current reaches the bulb 160.

A second mode illustrates a 'closed' circuit 155, where the switch is in functional and in an 'ON' position. For the same voltages illustrated a closed circuit 155 results in an on-phase power dissipation of the bulb 150, for example dissipating only '1' Watt.

However, as illustrated in the graph 200 of FIG. 2, the inventors have also identified a failure mode that is of particular concern for power switches. FIG. 2 shows the electrical characteristic of a failed power switch device particularly highlighting a failure mechanism that might exist: a resistive short circuit 255. The metal oxide semiconductor field effect transistor (MOSFET) device acts like a resistance with no control, i.e. the switch no longer operates as a switch since it cannot be placed in an 'ON' or 'OFF' mode of operation.

For the voltages illustrated, the bulb 250 is turned on at a $V_{ds}$ of 100 mV with a 10 A $I_{ds}$ current, and is turned off with a 12V drain-source voltage with a nominal $I_{ds}$. With a semi-short circuit 255, the gate-source voltage $V_{gs}$ follows a linear operation 205. However, this results in an on-phase power dissipation of the bulb 250, for example of the order of '30' Watts. Such power dissipation causes a significant and damaging effect on the driver and switch, as well as the load, i.e. the bulb in this case. In particular the switch suffers from excessive amounts of heat.

Typically, when a predetermined 'maximum' operating temperature threshold is exceeded, a controller is arranged to shut down the power switch, or at least reduce the power supplied, thereby preventing a significant and potentially damaging increase in temperature within the power switch. This process is often referred to as the 'shutdown/restart' principle. Once the IC has cooled down, for example by, say, 10° C., the IC may be switched 'ON' again.

In order to implement a 'shutdown/restart' operation, temperature sensors, which are typically configured as resistors, diodes or transistor sensors, are by necessity integrated in close proximity to the corresponding hottest point in the power switch.

There exist a number of techniques for on-chip temperature sensing. One technique includes the use of a pair of on-chip thermally responsive diodes, coupled to an off-chip current source. The diode pair generates a differential voltage output that is proportional to temperature. This technique for sensing on-chip temperatures requires numerous connections between the IC and external circuitry for each temperature sensing circuit.

Small, self contained on-chip temperature sensors have a much lower cost than sensors requiring connections to circuitry external to the IC. External sensors are those sensors that are not located on the IC itself. These sensors do not provide real-time results. Furthermore, the sensors are unable to measure the circuit temperature at the location on the IC of the highest power dissipating circuit.

U.S. Pat. No. 6,323,531 B1 describes a two-chip power IC, in which a sensor chip comprises a sensor and is mounted on a switch chip having a switch. The sensor is electrically connected to the switch in order to turn the switch 'off' when a temperature detected by the sensor exceeds a threshold value.

European patent application EP 0 262 530 A1 describes a configuration comprising a power IC and a control circuit, which is integrated in a semiconductor chip. The power IC, together with the control circuit, is thereby mounted on one of the surfaces of the semiconductor chip.

Thus, the only known prior art in addressing excess operating temperatures of ICs, or their associated die, attempts to monitor the temperature at the hottest point of the device or the die. Consequently, a need exists to improve the reliability of an integrated circuit, for example one comprising a power device such as a silicon switch, relating to problems as a result of excess temperature effects, such as temperature gradient.

STATEMENT OF INVENTION

In accordance with aspects of the present invention, there is provided an integrated circuit comprising a power device located on a die and method of improving the reliability therefor, as defined in the appended Claims.

Figure 1:
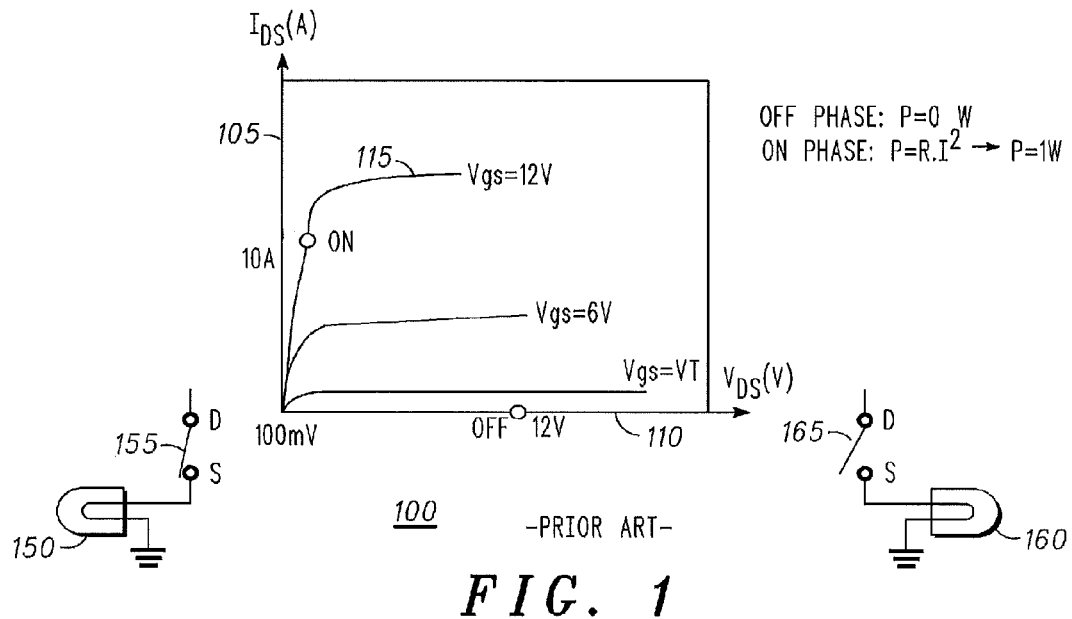
FIG. 1 illustrates a known device's operation, when it is functioning correctly.
Figure 2:
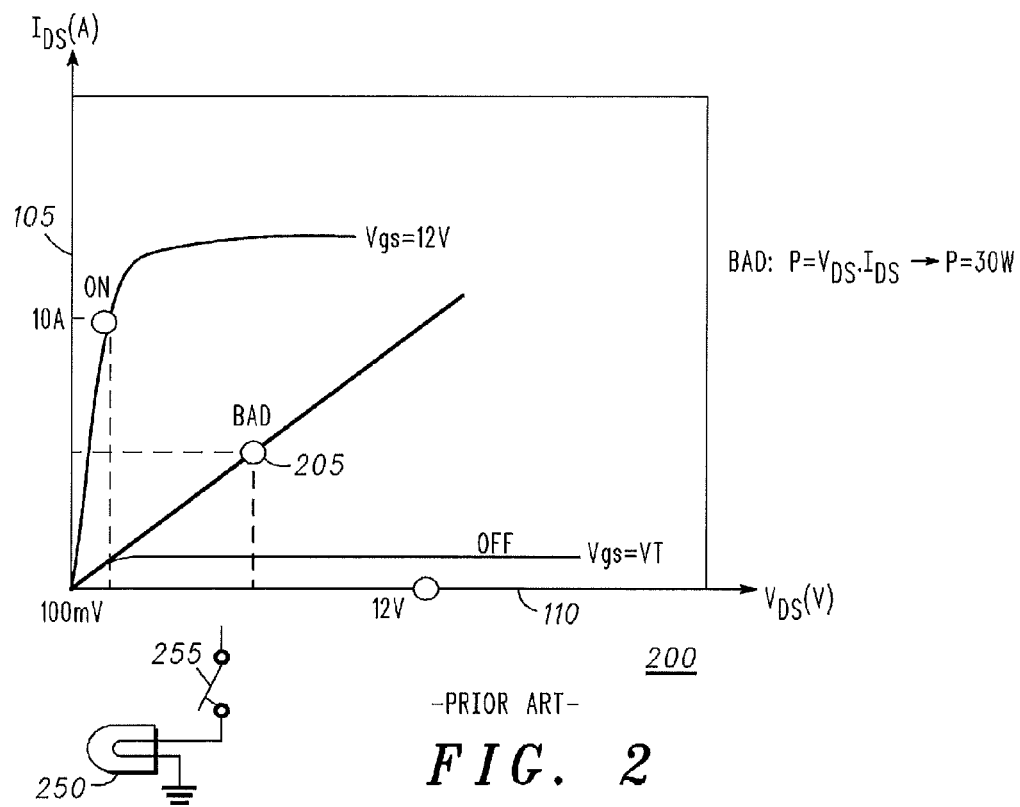
FIG. 2 illustrates graphically an electrical characteristic of a failed power switch device.
Figure 3:
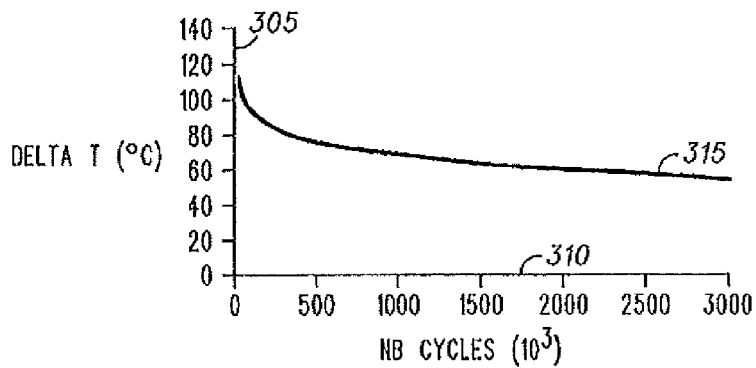
Figure 4:
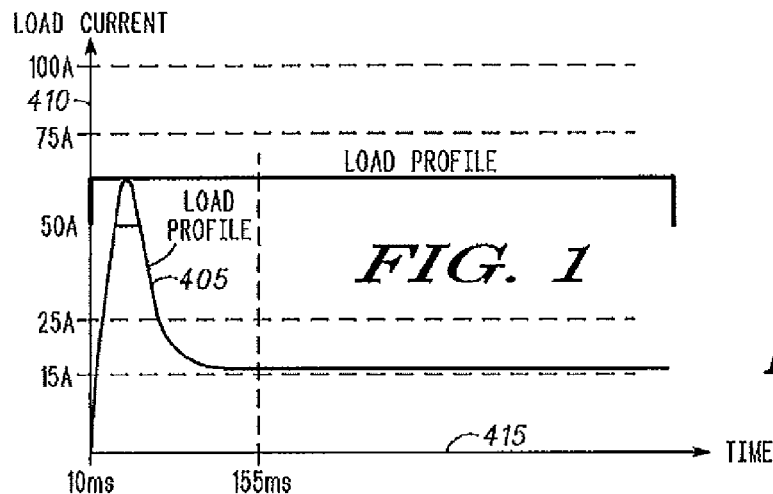
Figure 5:
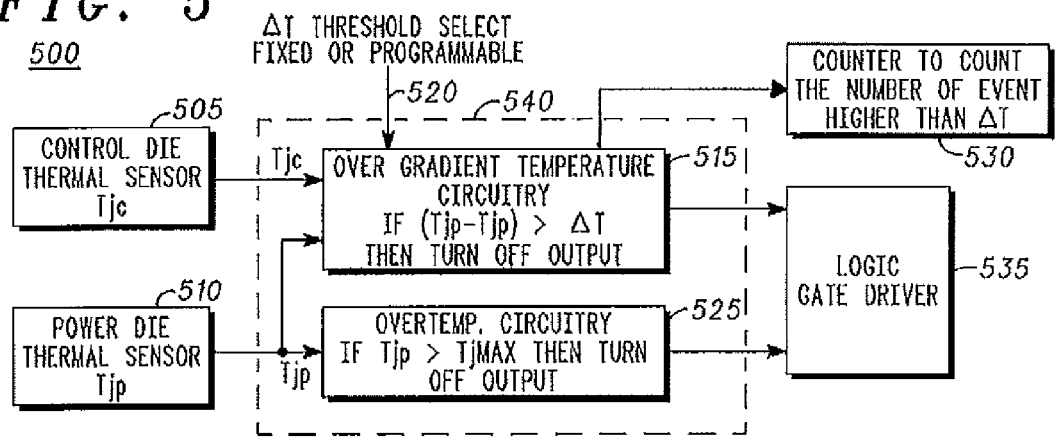
Figure 6:
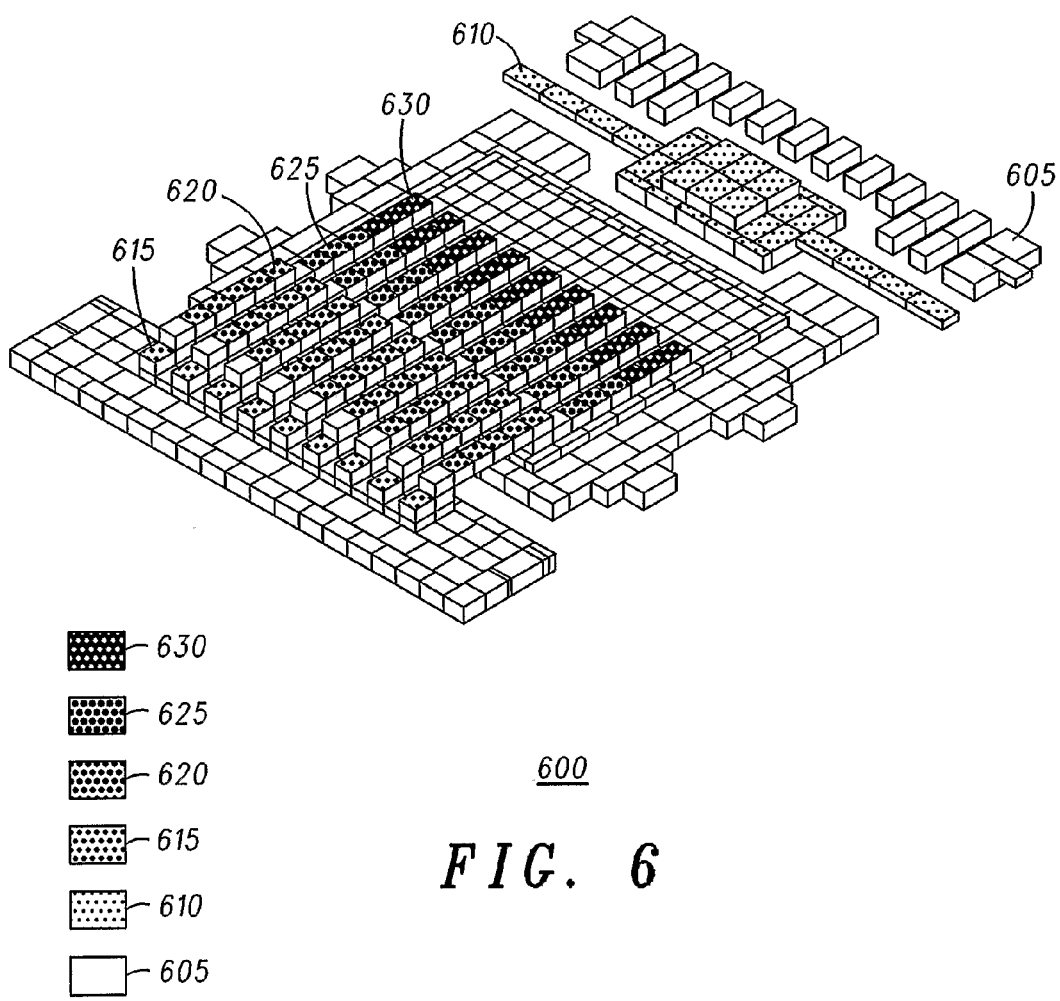
Figure 7:
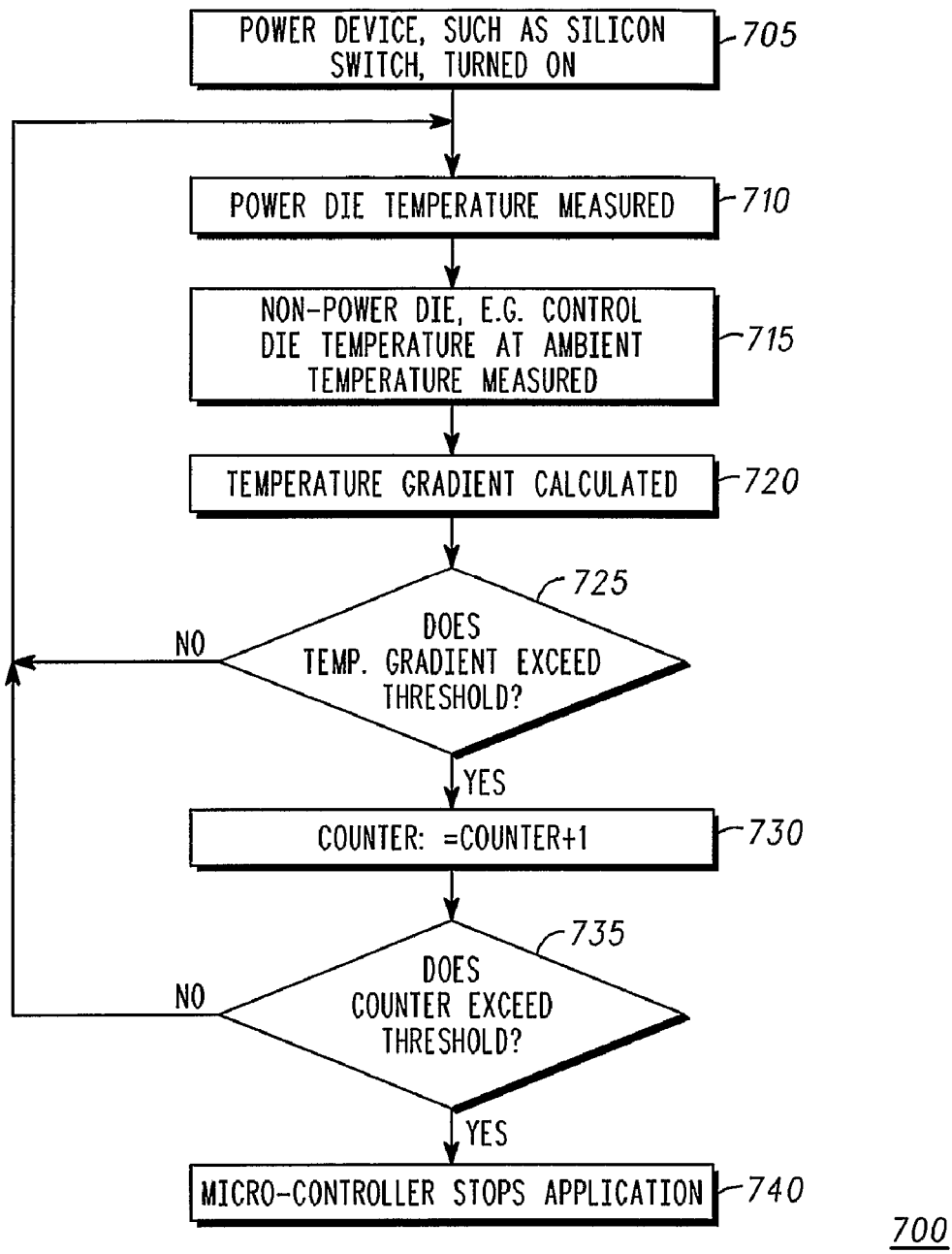

Exemplary embodiments of the present invention will now be described, by way of example only, with reference to the accompanying drawings, in which:

FIG. 3 illustrates graphically empirical data relating to an operation of a silicon switch;

FIG. 4 illustrates graphically an example of a light bulb's current profile, with the inrush current that generated a temporary and damaging high temperature gradient across the silicon switch;

FIG. 5 illustrates a block diagram of an integrated circuit, adapted to identify a temperature gradient across a silicon switch located on the integrated circuit and accordingly react to the calculated temperature gradient, in accordance with the preferred embodiment of the present invention;

FIG. 6 illustrates graphically a 3-dimensional electro-thermal simulation highlighting the identification of a temperature gradient across a silicon switch as caused by a short power pulse; and FIG. 7 illustrates a method of improving a reliability of an integrated circuit comprising a power device such as a silicon switch, in accordance with the preferred embodiment of the present invention.

DESCRIPTION OF PREFERRED EMBODIMENTS

The preferred embodiment of the present invention will be described in terms of an integrated circuit comprising a dual die silicon switch arrangement. However, it will be appreciated by a skilled artisan that the inventive concept herein described may be embodied in any type of integrated circuit comprising a power device that switches a load, i.e. a circuit comprising a power stage, whether or not in a dual die design.

Empirical temperature information is often provided for devices, such as the one illustrated in the graph 300 in FIG. 3. Here, the estimated lifetime of a device varies 315 for a number of cycles 310 operating at a particular temperature gradient 305.

Notably, the inventors of the present invention have identified a further primary root cause of failure of integrated circuit comprising power devices, in the context of repetitive over-load conditions. In particular, even if the device stays within its maximum temperature ratings, the inventors have identified that a repetitive large gradient of temperature across a die will still be found to damage the device.

It is known that some high power devices, such as eXtreme™ switches manufactured by Freescale Semiconductor Inc™ utilise two chip/integrated circuit (IC) solutions. Here, a first 'power' chip is designed to handle all of the high power signals and a second 'control' chip is utilized to provide low-power control signals to the power chip. The control chip is on a separate flag, which ensure a good transient thermal insulation from the power stage. For this dual chip family of product, it was found that a gradient of temperature occurring between the hottest point of the power stage and the backside of the die package was substantially equivalent to the gradient of temperature between the hottest point of the power stage and the ambient temperature of the control die.

In summary, the preferred embodiment of the present invention proposes to monitor the temperature delta between the power die and a location at an ambient or near ambient temperature. Preferably, the ambient temperature is measured at the control die. A circuit measures the difference of temperature between the respective temperature sensors. When a particular temperature gradient is exceeded, regardless of the absolute temperature of the die or device, a counter is incremented to record the event.

In this manner, a number of times when a temperature gradient is exceeded can be recorded. Thus, and advantageously, the inventive concept of the present invention utilizes the fact that a short duration power pulse on the power die does not have a major impact on the control die temperature.

In the context of the present invention, a skilled artisan will appreciate that the expression an 'Integrated circuit' encompasses an electronic component made of die/dice moulded in a package. The die (sometimes referred to as a 'chip') are mounted, for example glued or soldered, on a piece of metal called a flag.

Referring now to FIG. 4, a graph 400 illustrates graphically the effects of a short duration of power (in the form of an inrush current profile) 405 being generated and applied to a power device, such as a silicon switch, on a die to create a high temperature gradient across the silicon switch. The graph 400 illustrates load current 410 versus time 415.

The preferred embodiment of the present invention is applied to an integrated circuit comprising a dual die application, for example a power die operably coupled to a control die. When a short duration power pulse is applied on the power die, the pulse creates a gradient of temperature within the die itself and from the power junction to an area of the die exhibiting an ambient temperature. Notably, in the preferred embodiment of the present invention the monitoring of the ambient temperature is performed at the control die. Thereafter, the maximum gradient of temperature in the device can be determined by monitoring the temperature of the control die and the temperature of the power die and calculating the $\Delta T$ therebetween.

Preferably, the control die is arranged to comprise a programmable over-current latch-off protection circuit, which advantageously prevents the current applied to the power device from being high for a long time. In addition, and preferably, the control chip is located on a separate flag, which ensures a good transient thermal insulation from the power stage.

Referring now to FIG. 5, a block diagram of an integrated circuit 500 comprising a power device and adapted to identify a temperature gradient across a silicon switch, and accordingly configured to react to the temperature gradient, is illustrated in accordance with the preferred embodiment of the present invention. The integrated circuit preferably comprises two dice, a power die having (or operably coupled to) a first thermal sensor $T_{jp}$ 510 and a control die having (or operably coupled to) a second thermal sensor $T_{jc}$ 505.

A skilled artisan will appreciate that a variety of temperature sensors may be used in conjunction with the inventive concepts herein described, for example, a diode of PN junction or resistances.

The first and second thermal sensors provide temperature information to a processing function 515 of, say, a digital circuit 540, which calculates the temperature variation (gradient) ($\Delta T$) between the power die and the control die. Preferably, the processing function 515 receives an input of a particular $\Delta T$ threshold 520 between the power die and the control die. It is envisaged that this $\Delta T$ threshold 520 may be either fixed (for example as specified by the power device manufacture) or programmable.

The digital circuit, in the preferred embodiment of the present invention, may comprise any digital circuitry, for example any circuitry from a few digital logic gates up to a microcontroller-based arrangement.

The processing function 515 preferably outputs a signal that indicates a time period that the ΔT value has exceeded a threshold. For example, when the difference between the control die and power die exceeds a given ΔT threshold 520, such as 60° C., the processing function 515 or the digital circuit 540 reacts to the calculation of whether the ΔT calculation exceeds the ΔT threshold. For example if the calculated ΔT value exceeds the ΔT threshold either the power device is shut down 535 or the device increments a counter to count the number of gradient temperature events accumulated above the ΔT threshold 520.

Preferably, this ΔT value is input to a counter 530, which is arranged to count the time elapsed for which the ΔT value has been exceeded. Furthermore, the processing function 515 identifies by how much the ΔT threshold has been exceeded. Then, it is envisaged that after a given number of gradient thermal events, which have exceeded the threshold, a digital circuit associated with the circuit is able to decide to stop or turn 'OFF' the application. The turn 'OFF' may be made until the power device is replaced or a problematic circuit or device has been replaced.

Thus, the processing function 515 may also provide a control signal to a logic gate driver 535, which is arranged to regulate the power supplied to the power device on the power die, dependent upon the ΔT value calculated and/or the amount of time or number of times this value has been exceeded.

Preferably, the power die thermal sensor 510 also provides a thermal sensor indication to an over-temperature circuit 525, which is arranged to turn off the logic gate driver 535 when the condition $T_{jp} > T_{jmax}$ is satisfied (where $T_{jmax}$ is a maximum temperature supportable by the power die).

Thus, in this manner, the present invention implements a delta temperature protection mechanism by reading the temperature difference between the control and power dice.

Referring now to FIG. 6, the results of a 3-dimensional (3D) electro-thermal simulation 600 when the inventive concepts are applied to a Freescale™ MC33982, soldered on a printed circuit board (PCB), is illustrated. A power pulse is issued with a current of 120 A for a period of 800 msec, with a variation in temperature 605, 610, 615, 620, 625, 630 illustrated across the power die as shown.

In effect, the short duration power pulse on the power die creates a temperature gradient from the power junction of the device to the PCB. This temperature gradient has been identified as sufficiently close to the gradient of temperature from the power die to the control die, as shown in equation [1] below:

$$(Tj_{power\ max} - Tj_{control\ max}) = (Tj_{power\ max} - T_{amb}) \quad [1]$$

Referring now to FIG. 7, a flowchart 700 of the preferred mechanism for protecting an integrated circuit comprising a power device, such as a silicon switch, is shown. The power device is turned 'ON' at step 705. The temperature of the power die is measured in step 710 and the ambient temperature, say of a non-high power die, such as a control die, is measured in step 715. The temperature gradient between the power die and the non-high power die (i.e. control die) is then calculated, say by a micro-controller operably coupled to both dice, as shown in step 720.

A determination is then made as to whether the calculated temperature gradient has exceeded a threshold, in step 725. If the temperature gradient has not exceeded a threshold, in step 725, the process continues with the temperature measurements in step 710 and step 715. If the temperature gradient exceeded a threshold, in step 725, then a Counter is preferably incremented in step 730.

A determination is then made as to whether the Counter has exceeded a threshold, in step 735. If the Counter has not exceeded a threshold, in step 735, the process continues with the temperature measurements in step 710 and step 715. If the Counter exceeded a threshold, in step 735, then the micro-controller (or similar device) may decide to halt the application, or turn 'OFF' the power device or problematic circuit or device, in step 740.

It will be understood that an integrated circuit comprising a power device and method of improving reliability thereof, as described above, aims to provide at least one or more of the following advantages:

(i) Improved reliability of the power device, utilising the fact that its thermo-mechanical stress reliability strongly depends upon the temperature gradient across the die rather than the number of times it reaches an excessive temperature.

(ii) The temperature gradient information, together with the number of times this gradient exceeds a particular threshold, can be processed internally by a micro-controller of an associated circuit.

(iii) The performance offers even greater improvement with a multi-chip device, where the temperature of non-high power devices (or die), operating at close to the ambient temperature, can be used to calculate the temperature gradient.

In particular, it is envisaged that the aforementioned inventive concept can be applied by a semiconductor manufacturer to any integrated circuit, for example one comprising a power device such as a lamp driver arrangement or motor driver, for example those of the Freescale Semiconductor™ eXtreme™ Switch family. Furthermore, the inventive concept can be applied to any control die, for example where the digital area of the silicon is very small, such as the SMOS8MV™ as manufactured by Freescale Semiconductor™. It is further envisaged that, for example, a semiconductor manufacturer may employ the inventive concept in a design of a stand-alone device, such as a lamp driver integrated circuit, or application-specific integrated circuit (ASIC) and/or any other sub-system element.

Whilst the specific and preferred implementations of the embodiments of the present invention are described above, it is clear that one skilled in the art could readily apply variations and modifications of such inventive concepts.

Thus, an improved protection arrangement for an integrated circuit comprising a power device (and/or die) such as a silicon switch, and method for improving a reliability thereof have been described, wherein the aforementioned disadvantages with prior art arrangements have been substantially alleviated.

The invention claimed is:

1. An integrated circuit comprising:
   a power device located on a die;
   a processing function operably coupled to the power device, wherein the processing function is operably coupled to two or more temperature sensors wherein a first temperature sensor is operably coupled to the power device to measure a temperature of the power device and the second temperature sensor is located such that it measures a substantially ambient temperature related to the die and the processing function determines the temperature gradient therebetween; and
   a counter, operably coupled to the processing function and arranged to count a number of times that the determined temperature gradient exceeds a threshold value.

2. An integrated circuit according to claim 1, wherein the second temperature sensor is operably coupled to a non-high power device or die.

3. An integrated circuit according to claim 1, wherein the power device is a silicon switch.

4. An integrated circuit according to claim 1 wherein the processing function is a digital circuit and in response to the digital circuit determining the temperature gradient between the power device and an ambient temperature, the digital circuit implements a protection process to protect the power device.

5. An integrated circuit according to claim 4 wherein the processing function is operably coupled to a logic gate driver and the protection process comprises switching off the power device by the logic gate driver or reducing the power applied thereto.

6. An integrated circuit according to claim 5, wherein the second temperature sensor is operably coupled to a non-high power device or die.

7. An integrated circuit comprising:
a power device located on a die;
a processing function operably coupled to the power device, wherein the processing function is operably coupled to two or more temperature sensors wherein a first temperature sensor is operably coupled to the power device to measure a temperature of the power device and the second temperature sensor is operably coupled to a non-high power device or die and is located such that it measures a substantially ambient temperature related to the die and the processing function determines the temperature gradient therebetween, wherein the non-high power device or die is a control die.

8. An integrated circuit according to claim 7, further comprising a counter, operably coupled to the processing function and arranged to count a number of times that the calculated temperature gradient exceeds a threshold value.

9. The integrated circuit according to claim 7 wherein the die and the control die are in a dual die arrangement.

10. An integrated circuit according to claim 7, wherein the power device is a silicon switch.

11. An integrated circuit according to claim 10, further comprising a counter, operably coupled to the processing function and arranged to count a number of times that the calculated temperature gradient exceeds a threshold value.

12. An integrated circuit according to claim 7 wherein the processing function is a digital circuit and in response to the digital circuit determining the temperature gradient between the power device and an ambient temperature, the digital circuit implements a protection process to protect the power device.

13. An integrated circuit according to claim 12 wherein the processing function is operably coupled to a logic gate driver and the protection process comprises switching off the power device by the logic gate driver or reducing the power applied thereto.

14. An integrated circuit according to claim 13, further comprising a counter, operably coupled to the processing function and arranged to count a number of times that the calculated temperature gradient exceeds a threshold value.

15. A method of improving a reliability of an integrated circuit comprising a power device, the method comprising the steps of:
measuring a first temperature of the power device;
measuring a second ambient temperature associated with the power device, wherein the step of a measuring a second ambient temperature associated with the power device comprises measuring an ambient temperature of an associated non-high power die,
calculating a temperature gradient between the power device and the non-high power die in response to the steps of measuring;
determining whether the calculated temperature gradient has exceeded a threshold; and
implementing a power reduction process applied to the power device if the temperature gradient exceeds a threshold.

16. A method according to claim 15, further comprising:
incrementing a counter if the determined temperature gradient exceeds a threshold;
determining whether the Counter has exceeded a threshold;
implementing a power reduction process applied to the power device if the Counter exceeded a threshold.

17. The method of claim 15 wherein the non-high power die is an associated control die.

18. A method of improving a reliability of an integrated circuit comprising a power device, the method comprising the steps of:
measuring a first temperature of the power device;
measuring a second ambient temperature associated with the power device;
calculating a temperature gradient across a portion of the power device in response to the steps of measuring;
determining whether the calculated temperature gradient has exceeded a threshold;
implementing a power reduction process applied to the power device if the temperature gradient exceeds a threshold,
incrementing a counter if the determined temperature gradient exceeds a threshold;
determining whether the Counter has exceeded a threshold; and
implementing a power reduction process applied to the power device if the Counter exceeded threshold.

19. An integrated circuit comprising:
a power device located on a die; and
a processing function operably coupled to the power device, wherein the processing function is operably coupled to two or more temperature sensors wherein a first temperature sensor is operably coupled to the power device to measure a temperature of the power device and the second temperature sensor is located such that it measures a substantially ambient temperature related to the die and the processing function determines the temperature gradient therebetween;
wherein the processing function is a digital circuit and in response to the digital circuit determining the temperature gradient between the power device and an ambient temperature, the digital circuit implements a protection process to protect the power device;
wherein the second temperature sensor is operably coupled to a non-high power device or die.

20. An integrated circuit according to claim 19 wherein the processing function is operably coupled to a logic gate driver and the protection process comprises switching off the power device by the logic gate driver or reducing the power applied thereto.

21. An integrated circuit according to claim 19 further comprising a counter, operably coupled to the processing function and arranged to count a number of times that the calculated temperature gradient exceeds a threshold value.

* * * * *